United States Patent
Komatsu

(10) Patent No.: US 6,635,516 B1
(45) Date of Patent: Oct. 21, 2003

(54) SUBSTRATE DROPPING PREVENTION MECHANISM AND SUBSTRATE INSPECTION DEVICE PROVIDED THEREWITH

(75) Inventor: Manabu Komatsu, Yokohama (JP)

(73) Assignee: Nikon Corporation, Tokyo (JP)

( * ) Notice: Subject to any disclaimer, the term of this patent is extended or adjusted under 35 U.S.C. 154(b) by 35 days.

(21) Appl. No.: 09/857,489

(22) PCT Filed: Oct. 6, 2000

(86) PCT No.: PCT/JP00/07005

§ 371 (c)(1),
(2), (4) Date: Jun. 6, 2001

(87) PCT Pub. No.: WO01/27992

PCT Pub. Date: Apr. 19, 2001

(30) Foreign Application Priority Data

Oct. 8, 1999 (JP) ............................................ 11-288745

(51) Int. Cl.⁷ ............................................ H01L 21/335
(52) U.S. Cl. ....................... 438/143; 438/643; 438/678; 438/716
(58) Field of Search ................................. 414/404, 416, 414/225; 438/143, 643, 678, 716

(56) References Cited

U.S. PATENT DOCUMENTS 4,860,439 A * 8/1989 Riley ........................ 29/741
5,445,486 A * 8/1995 Kitayama et al. ...... 414/416.03
5,820,329 A * 10/1998 Derbinski et al. ...... 414/225.01

FOREIGN PATENT DOCUMENTS

| JP | U-63-84953 | 6/1988 |
| JP | A 9-129710 | 5/1997 |
| JP | A 9-148395 | 6/1997 |
| JP | A 10-92887 | 4/1998 |

* cited by examiner

Primary Examiner—David Nelms
Assistant Examiner—Dao H. Nguyen
(74) Attorney, Agent, or Firm—Oliff & Berridge PLC

(57) ABSTRACT

A substrate inspection device for carrying out visual inspection of a front surface and a rear surface of a wafer W is provided with an arm 21 for holding the wafer W on pad mounting sections 21b through suction. The arm 21 is moved by an arm driving mechanism between a substrate conveying position and a substrate inspection position. The arm 21 is a flat plate partially cut away and having a bracelet-shape, while the pad mounting sections 21b are arranged at specified intervals on the surface of the arm 21. Clip members 24 are arranged at specified intervals on the arm 21 so as to prevent the wafer W dropping off from the arm 21. If the arm 21 is moved to the substrate inspection position, the clip members 24 move to a substrate dropping position. If the vacuum suction of the pad mounting sections 21b is impaired, the wafer W would drop off, but instead they come into contact with the clip members 24 and dropping is prevented.

20 Claims, 6 Drawing Sheets

SUBSTRATE DROPPING PREVENTION MECHANISM AND SUBSTRATE INSPECTION DEVICE PROVIDED THEREWITH

The disclosure of Japanese Patent Application No. 11-288745 filed on Oct. 8th, 1999 is herein incorporated by reference.

TECHNICAL FIELD

The present invention relates to a substrate dropping prevention mechanism provided in a substrate inspection device used in inspection of the underside of semiconductor wafers etc., and to the substrate inspection device.

BACKGROUND ART

Conventionally, a wafer inspection device for carrying out macro observation has been used in observation of the upper and lower surfaces of a semiconductor wafer etc. With this type of inspection device, the underside of a wafer is held by vacuum suction, and the underside is turned upward to facilitate observation and inspection. For this reason, with this inspection device, as shown in FIG. 7, a plurality of vacuum suction pads 2 are provided on an arm 1, and the wafer W is sucked up or set down under solenoid valve control (not shown).

A pivot section 3 is provided at one end of the arm 1, and as shown in FIG. 7 and FIG. 8, a shaft 4 is fixed in a horizontal state to both sides of the pivot section 3. The both ends of the shaft 4 pass through support members 5, 6 of the substrate inspection device so that the arm 1 is capable of rotating around the shaft 4. As shown in FIG. 7, FIG. 8, FIG. 9A and FIG. 9B, a pulley 7 is fixed to an end of the shaft 4. A pulley 9 is also fixed to the axis of rotation 10a of a motor 10 fixed to a base plate 11. A belt 8 is wound around the pulley 7 and the pulley 9. If the motor 10 rotates the pulley 9, the arm 1 is swung and is stopped at any desired angle, as shown in FIG. 9B, then the underside of the wafer W can be inspected. This type of inspection device is generally used in combination with a conveying device.

However, with the inspection device of the related art, there are the following problems. When the wafer is tilted, that is, during the operation of moving from the horizontal state to the inspection angle, during inspection at the inspection angle, or during an operation of moving from the inspection angle to the horizontal state, if the vacuum suction is defective, the wafer will fall off and is likely to be damaged. Here, defective vacuum suction is caused by, for example, the vacuum being cut off, or malfunctioning etc.

DISCLOSURE OF THE INVENTION

An object of the present invention is to provide a substrate dropping prevention mechanism so that a substrate does not fall off even if vacuum suction becomes defective, and a substrate inspection device provided with the substrate dropping prevention mechanism.

The present invention is applied to a substrate dropping prevention mechanism fitted to a substrate holding device provided with a holding section for holding a substrate by sucking a first surface, and a tilt mechanism for tilting the holding section.

The object described above is achieved by providing a dropping prevention member moving between a support posture for supporting a substrate that has come away from a support section, and a retracted posture that is different from the support posture, and a movement mechanism for setting the dropping prevention member to the retracted posture when the substrate is substantially horizontal with a first surface facing downwards and a second surface facing upwards, and setting the dropping prevention member to the support posture when the substrate is tilted over a specific angle with respect to the horizontal by the tilting mechanism.

The dropping prevention member has a first dropping prevention surface, confronting a peripheral surface of the substrate, and a second dropping prevention surface, confronting the second surface of the substrate, and the first and second dropping prevention surfaces are preferably formed so as to respectively confront the peripheral surface and second surface of the substrate when the dropping prevention member is moved to the support posture. The second dropping prevention surface preferably confronts the second surface of the substrate with a specified gap between them.

A moving mechanism can cause movement of the dropping prevention member between the retracted posture and the support posture by interlocking with a operation of the holding section using the tilt mechanism. In this case, the dropping prevention member is constantly urged to the support posture side under spring force, and can be provided with a linkage member for moving the dropping prevention member to the retracted posture against the biasing force of the spring when the holding section is rotated to the horizontal state. Also, when the holding section in the tilted state is moved to the horizontal state, the linkage member moves the dropping prevention member to the retracted posture opposing the spring force, while when the holding section in the horizontal state is moved to the tilted state, the dropping prevention member is moved to the support posture by the spring force.

The dropping prevention member is preferably formed from a plurality of dropping prevention parts provided at specified intervals on the holding section. The plurality of dropping prevention parts are arranged and postured so that conveyance of the substrate to the holding section is not prevented when moved to the retracted posture.

More specifically, in the case where the substrate is a wafer, the holding section is formed from a flat bracelet shaped plate that is partially cut away, and fits the outer shape of the wafer, suction sections are arranged at predefined intervals on one surface of the bracelet shaped flat plate, and the dropping prevention parts are arranged at predetermined intervals on the bracelet shaped flat plate so as to prevent the substrate dropping off from the one surface of the bracelet shaped flat plate.

A substrate inspection device for carrying out visual inspection of upper and lower surfaces of a substrate according to the present invention achieves the above object by providing a holding section for holding a substrate by suction using a suction section, a tilting mechanism for tilting the holding section so as to move the substrate between a horizontal state and a tilted state, and a substrate holding device having the substrate dropping prevention mechanism as described above.

BRIEF DESCRIPTION OF THE DRAWINGS

FIG. 2 is at the substrate conveying position.

FIG. 5 is moved to the substrate inspection position.

BEST MODE FOR CARRYING OUT THE INVENTION

Figure 1:
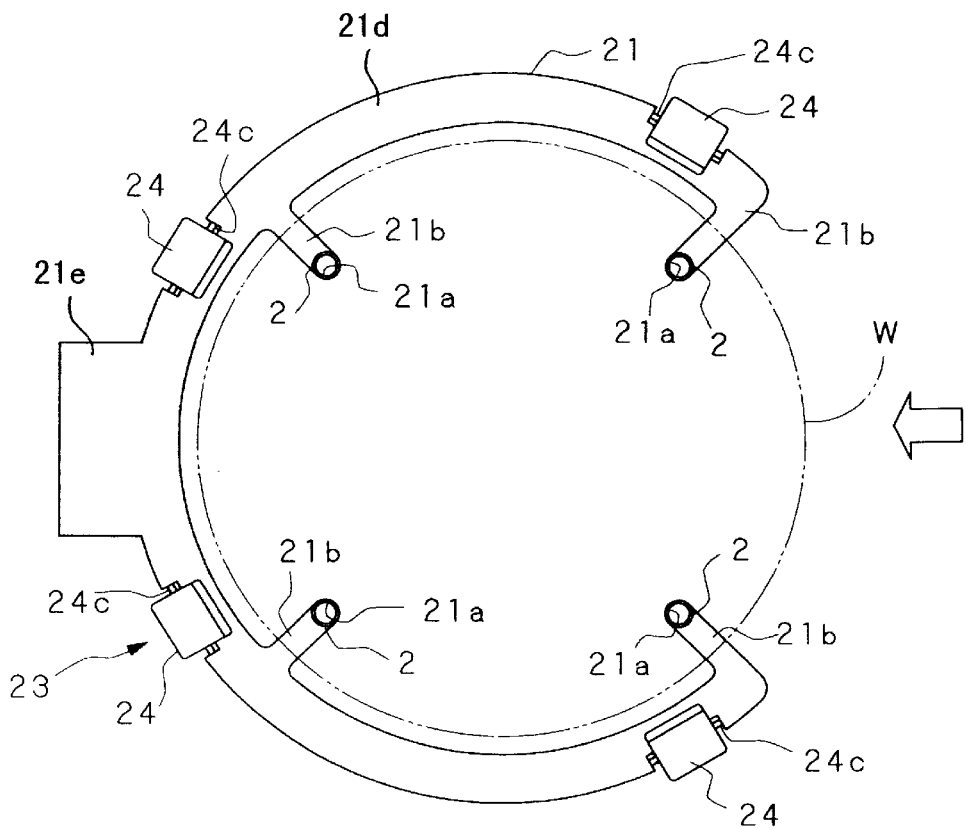
FIG. 1 is a plan view of one embodiment of a substrate inspection device provided with a substrate dropping prevention mechanism of the present invention, when an arm is in a substrate conveying position.

One embodiment of a substrate inspection device fitted with a substrate dropping prevention mechanism of the present invention will be described in the following with reference to FIG. 1–FIG. 6. The same reference numerals as in FIG. 7–FIG. 9A and FIG. 9B will be used for the same parts in FIG. 1–FIG. 6.

The substrate examination device of this embodiment is for visual inspection of a front surface S and rear surface R of a semiconductor wafer W such as a silicon wafer. As shown in FIG. 1–FIG. 6, the substrate inspection device comprises an arm (holding section) 21 for holding a wafer by vacuum suction of a rear surface R of the wafer W, an arm drive mechanism (tilting mechanism) 22 for rotating the arm 21 relative to a shaft 4 to tilt or invert the wafer W, and a wafer dropping prevention mechanism (substrate dropping prevention mechanism) 23 for preventing the wafer W falling off when the wafer W vacuum sucked to the arm 21 is tilted or inverted by the arm 21.

As shown in FIG. 1, the arm 21 is comprised of a base section 21d formed into a partially cut-away bracelet shaped flat plate, four pad mounting sections 21b projecting to the inner side in a radial direction from the base section 21d, and spaced at specified intervals in a circumferential direction, and a pivot section 21e provided on one side of the base section 21d. Suction holes 21a for vacuum suction are formed in the tips of the pad mounting sections 21b, and pads 2 are provided around the circumference of these holes. A vacuum suction device, not shown in the drawings, connects with the suction holes 21a and switches between vacuum suction and release of vacuum suction, using a solenoid valve, not shown.

The arm drive mechanism 22, similarly to the previously described prior art, is arranged on support members 5, 6 (for the support member 5, refer to FIG. 7) erected on the base plate 11 of the substrate inspection device. Both ends of a shaft 4 fixed to the pivot section 21e of the arm 21 pass through support members 5, 6, and the arm 21 can be rotatable around the shaft 4. A pulley 7 is attached to one end of the shaft 4, and a pulley 9 is attached to a rotating shaft of a motor 10 fixed to the base plate 11. A belt 8 is wound around these pulleys 7 and 9. When the motor 10 rotates, the pulleys 7, 9 are rotated so as to rotate the shaft 4, and thus the arm 21 is swung.

Figure 2:
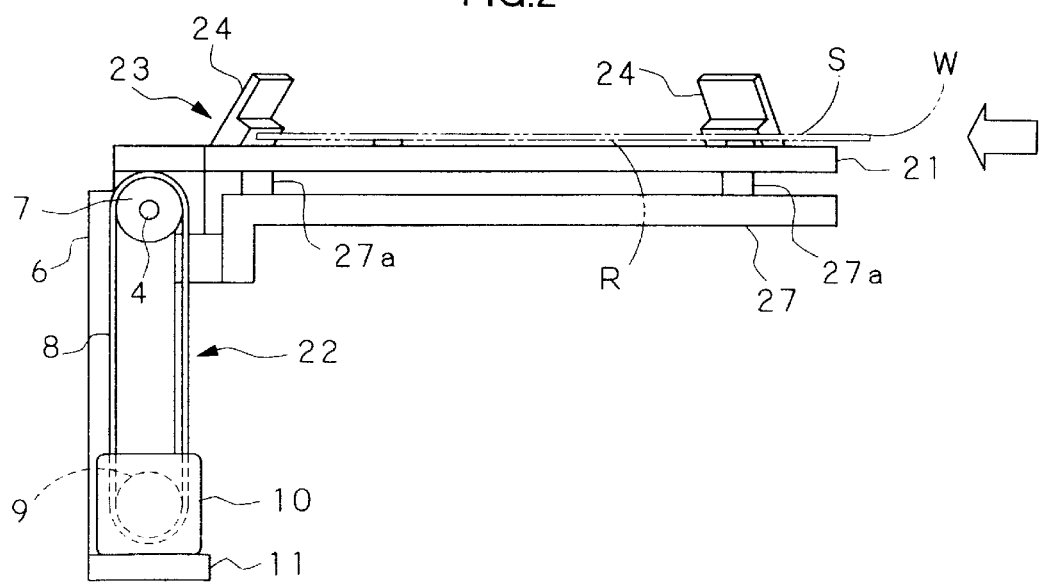
FIG. 2 is a side elevation of the substrate inspection device of FIG. 1.
Figure 3:
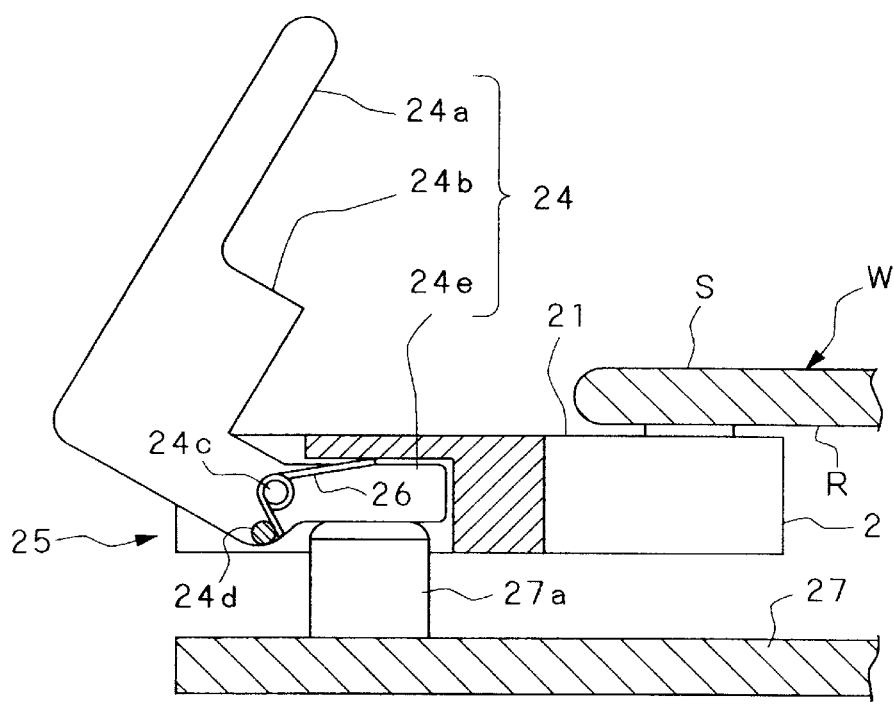
FIG. 3 is an enlarged cross sectional view of essential parts when a clip member shown in FIG. 1
Figure 4:
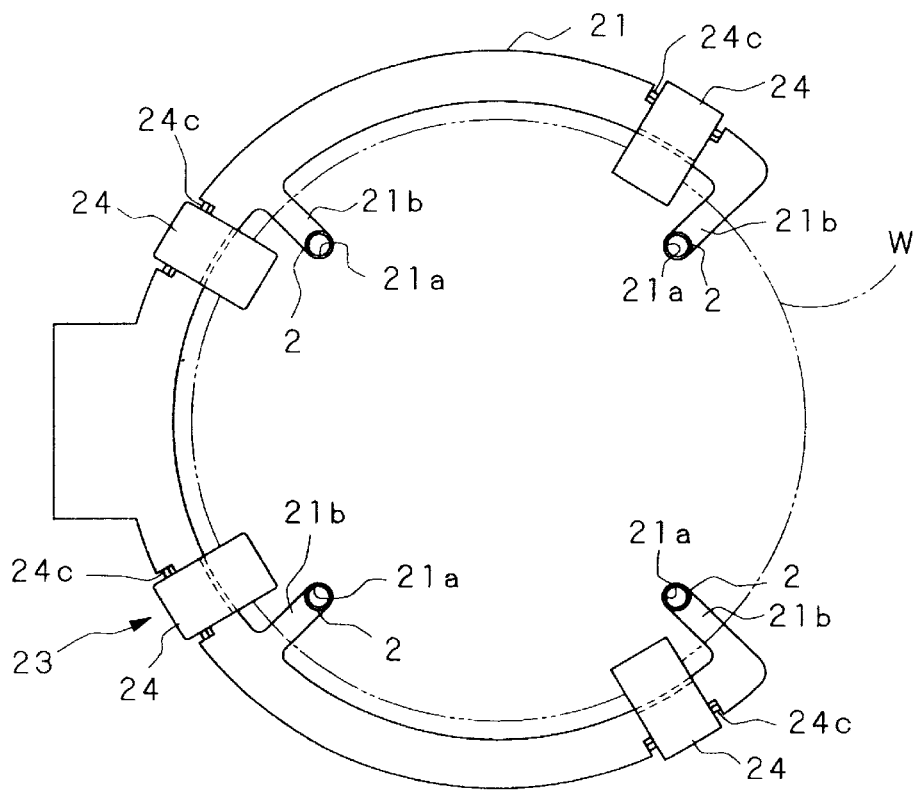
FIG. 4 is a plan view showing the arm of FIG. 1 in a tilted state.
Figure 5:
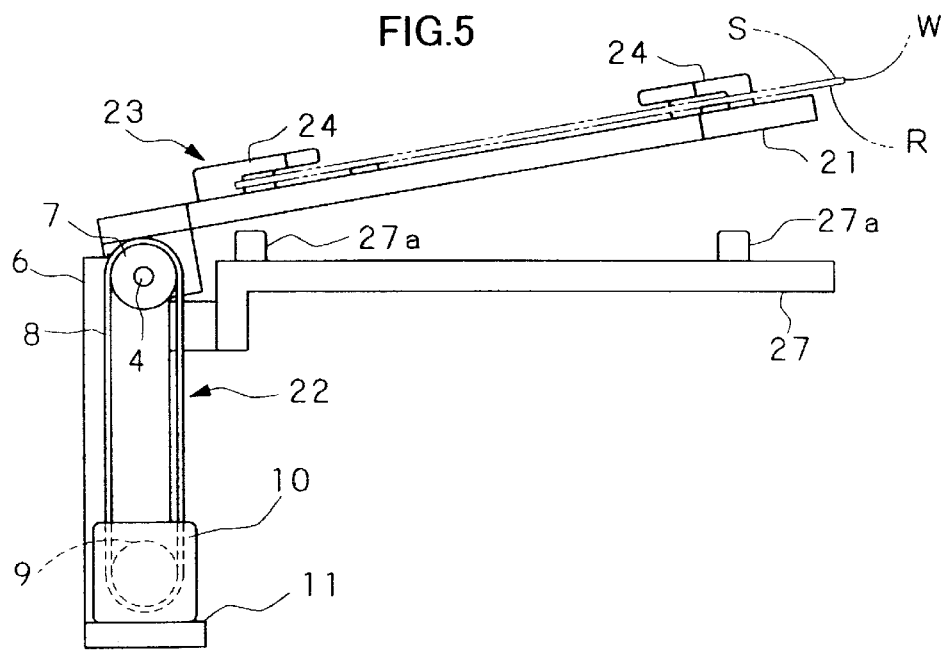
FIG. 5 is a side elevation of the substrate inspection device of FIG. 4.
Figure 6:
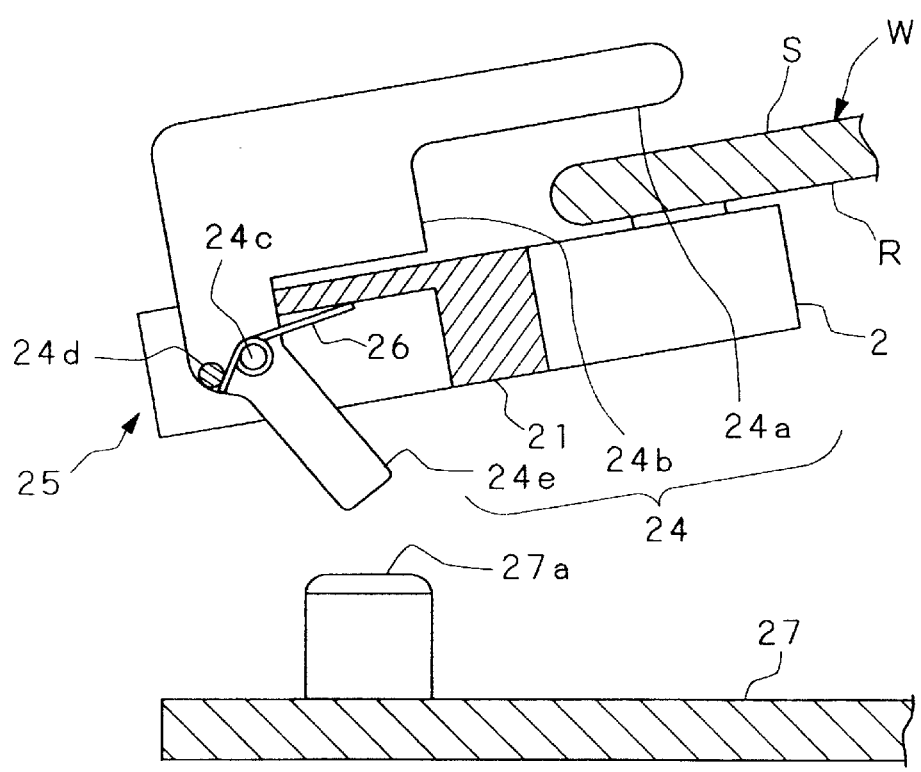
FIG. 6 is an enlarged cross sectional view of essential parts showing the state when the clip member shown in FIG. 4
Figure 7:
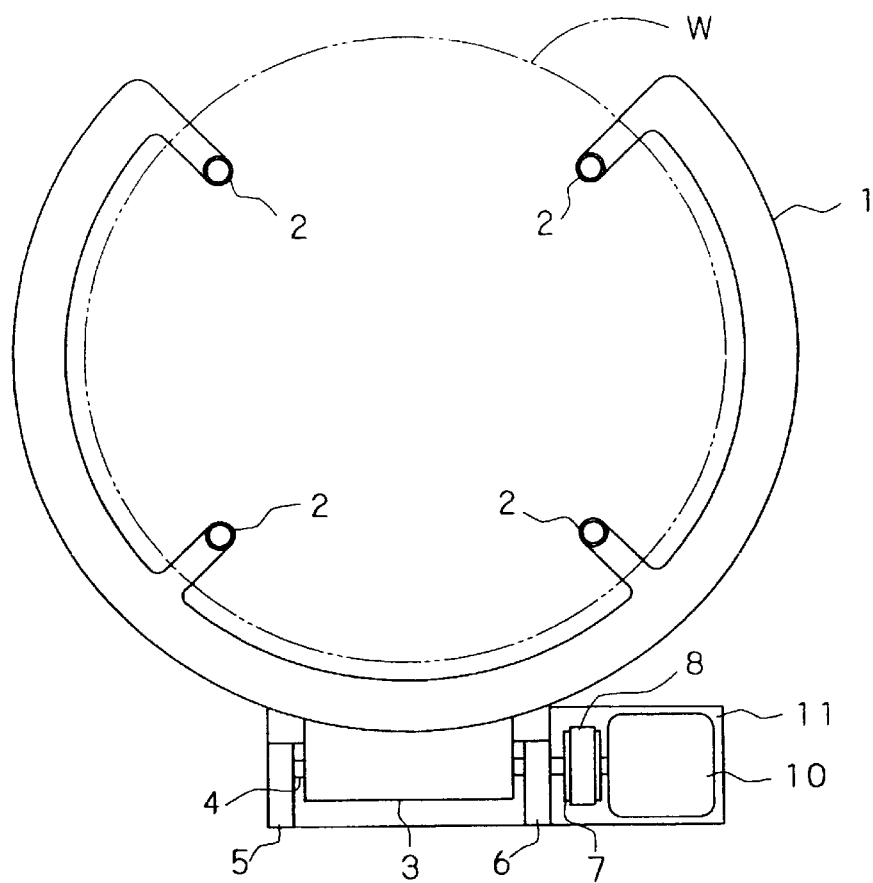
FIG. 7 is a plan view of a substrate inspection device of the related art.
Figure 8:
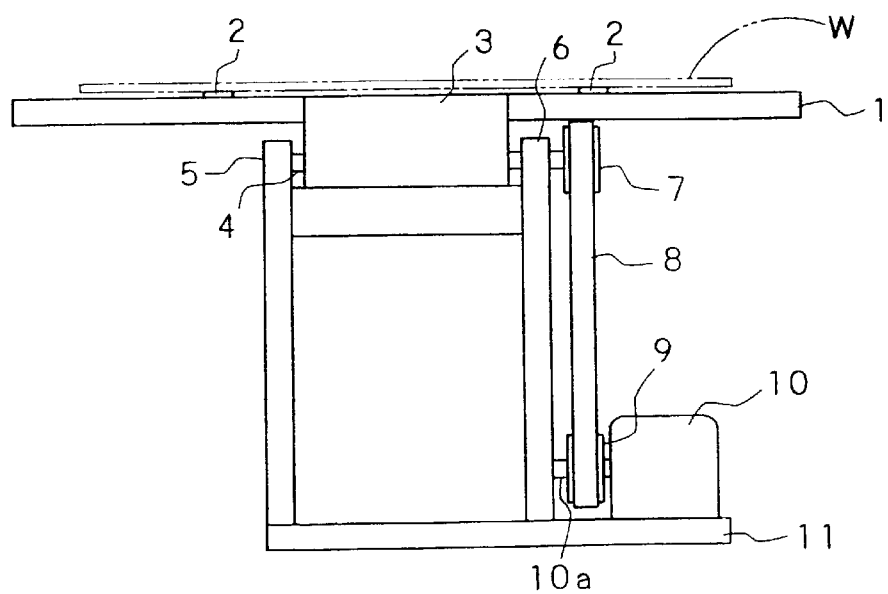
FIG. 8 is a rear view of the substrate examination device of FIG. 7.

The wafer dropping prevention mechanism 23 is provided with four clip members (dropping prevention parts) 24 and clip member moving mechanisms 25. The clip member movement mechanisms 25 move the clip members 24 between a substrate conveying position (retracted posture) and a falling prevention position (support posture). FIG. 1–FIG. 3 show the clip members 24 moved to the substrate conveying position. At this time, a wafer W being conveyed by a conveyance device, not shown, is mounted on the arm 21 and is not hindered by the clip members 24. FIG. 4–FIG. 6 show the clip members 24 moved to the dropping prevention position. The four clip members 24 have a function of supporting the wafer W if the wafer comes away from the arm 21 due to defective vacuum suction and preventing the wafer falling off.

As shown in FIG. 3, a tip abutment member 24a and a stepped abutment member 24b are provided on the clip members 24. The tip abutment member 24a extends towards the inner side in a radial direction of the arm 21, and supports the wafer W, if it should come away, by abutment with the surface S. The stepped abutment member 24b is formed outside the tip abutment member 24a in a radial direction of the arm 21, and supports the wafer W if it should come away by abutment with a peripheral section.

The clip members 24 are rotatably supported on the arm 21 using pins 24c. Coil springs 26 are attached to the pins 24c, with one end of each coil spring 26 contacting the arm 21, and the other end contacting projecting sections 24d provided on the clip members 24. An urging force keeping the clip members 24 horizontal with respect to the arm 21, namely a biasing force biasing the clip members 24 to the dropping prevention position, is applied to the clip members 24 by the coil springs 26.

Projection section for driving 24e are also formed on the clip members 24, projecting from the positions of the pins 24c. A bracelet shaped fixing member 27, arranged along the lower surface of the arm 21 in the substrate conveying position (in a horizontal state), is fixed to the support members 5, 6. Pressing pins 27a are erected on the upper surface of the fixing member 27 at positions corresponding to the clip members 24 respectively. When the arm 21 is in a horizontal state, the pressing pins 27a press the drive projection sections 24e of the clip members 24 and move them upwards.

Specifically, when the arm 21 is in the substrate conveying position, as shown in FIG. 3, the projection sections for driving 24e come into contact with the pressing pins 27a to rotate the clip members 24, and the tip abutment sections 24a are withdrawn from the surface S. When the arm 21 is in a tilted state (for example, in the substrate inspection position), as shown in FIG. 6, the projection sections for driving 24e are separated from the pressing pins 27a, and so the clip members 24 are swung in a clockwise direction in FIG. 3 by the coil springs 26. At this time, the tip abutment section 24a confronts substantially parallel with the surface S of the wafer W. The projection sections for driving 24e pressing pins 27a and the coil springs 26 constitute a clip member movement mechanism.

Next, a description will be given of the operation of the substrate inspection device of this embodiment.

As shown in FIG. 1 to FIG. 3, the arm 21 at the substrate conveying position is in the horizontal state. At this time, as shown in FIG. 3, the projection sections for driving 24e come into contact with and are pressed by the pressing pins 27a, the clip members 24 are rotated in a clockwise direction in FIG. 3, and the tip abutment sections 24a are withdrawn from the surface S. In this state, a wafer W that has been fed to the inspection device by the conveying device not shown is mounted on the arm 21 in the horizontal state, without being hindered by the clip sections 24, and is vacuum-sucked using the suction holes 21a of the pad mounting sections 21b. At the substrate conveying position, since the clip members 24 are moved away from the wafer W, that is as the clip members 24 are open, the clip sections 24 do not get in the way when performing visual inspection of the surface S of the wafer W.

Next, if the motor 10 runs at the substrate conveying position, the arm 21 starts being rotated around the shaft 4, via the pulley 9, belt 8 and pulley 7. At this time, as shown in FIG. 4–FIG. 6, since the clip members 24 are gradually separated from the pressing pins 27a, the clip members 24 are rotated towards the dropping prevention position by the coil springs 26. Finally, upon movement to the dropping prevention position, the projection sections for driving 24e become completely separated from the pressing pins 27a. As a result, the tip abutment sections 24a confront with the surface S of the wafer W while maintaining a specified gap. Also, the stepped abutment sections 24b confront with the edge of the wafer W while maintaining a specified gap.

Figure 9A:
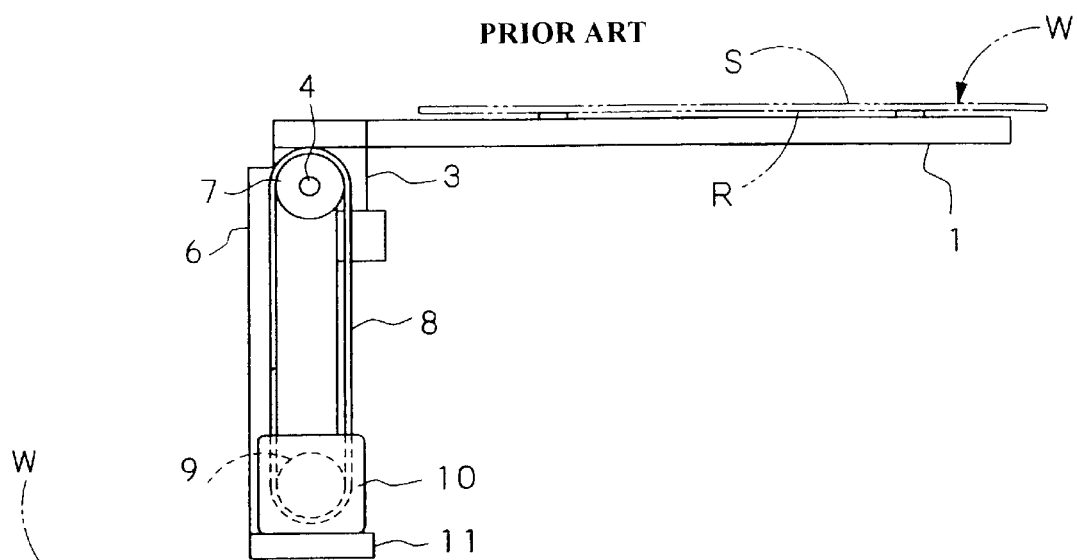
FIG. 9A is a side elevation of the substrate inspection device of FIG. 7 and FIG. 8 when the arm is at the substrate conveying position.
Figure 9B:
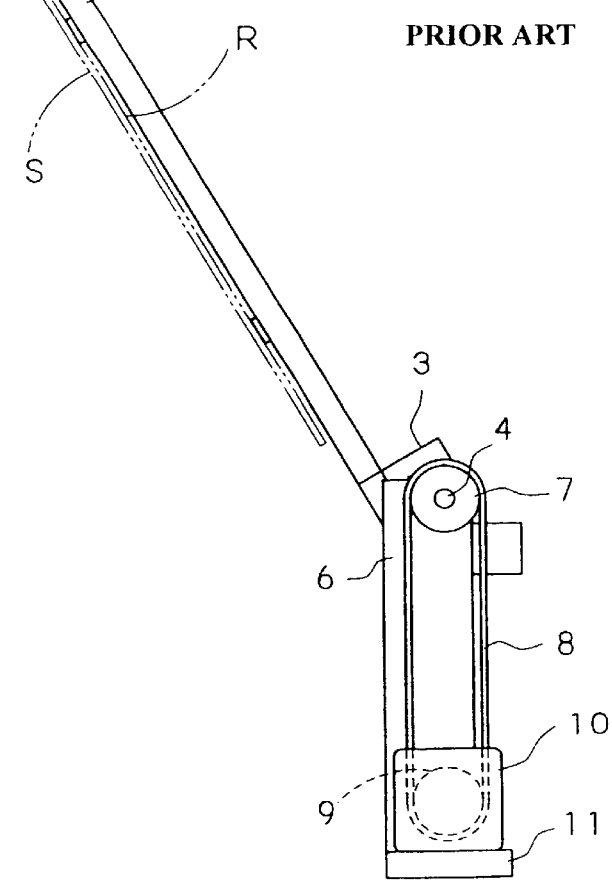
FIG. 9B is a side elevation of the substrate inspection device of FIG. 7 and FIG. 8 when the arm is at the substrate inspection position.

After the pressing pins 27a have been separated from the clip members 24, as shown in FIG. 9B, even if the arm 21 is rotated as far as a wafer reverse surface inspection angle, the arrangement of the arm 21 and the clip members 24 remains as shown in FIG. 6. In this state, if a defect occurs in the vacuum suction, dropping of the wafer W is prevented in the following manner. Even if the wafer W that has come away from the pads 2 is inclined to a side opposite to the arm 21 by the force of gravity, the wafer W abuts against the tip abutment sections 24a of the clip members 24 arranged opposite to the surface S. Even if the wafer W slides down along the arm 2, the wafer W abuts against the stepped abutment sections 24b of the clip members 24 arranged opposite to the edge of the wafer W.

After carrying out visual inspection of the rear surface R at the rear surface inspection position of FIG. 9B, the motor 10 rotates in reverse so as to return the arm 21 to the horizontal substrate conveying position. The clip members 24 are maintained in the state shown in FIG. 4 to FIG. 6 until the arm 21 is close to the horizontal state. When the arm 21 approaches the horizontal state, as the clip members 24 start to come into contact with the pressing pins 27 the clip members 24 rotate in an anticlockwise direction in FIG. 6 against the urging force of the coil springs 26. If the arm 21 arrives at the horizontal state shown in FIG. 1, then as shown in FIG. 3 the clip members 24 are withdrawn from the surface S of the wafer W and are put in a sprung-up state.

Also, when the arm 21 is being tilted as shown in FIG. 5, if a defect arises in the vacuum suction the wafer W slides down to the left along the arm 21, but the end surface of the wafer W abuts against the stepped abutment section 24b and the wafer W is prevented from dropping off.

Thus with this embodiment, when the wafer W is in the tilted state even if there is a defect in the suction due to disconnection of the vacuum and the wafer W comes away from the pads 2, the clip members 24 abut on the wafer W and it is possible to reliably prevent the wafer falling off. That is, in a rear surface macro inspection process, even if the vacuum suction is released due to disconnection of the vacuum or a malfunction, it is possible to prevent damage due to dropping off the wafer W.

The clip sections 24 interlock in the tilting operation of the arm 21, and are moved between a dropping prevention position and a substrate conveying position, which means that it is not necessary to use other drive devices such as actuators. As a result, it is possible to suppress the cost increase and increased complexity of the device.

When the clip sections 24 are at the dropping prevention position, the tip abutment sections 24a of the clip members 24 are separated by a specified distance from the surface of the wafer W, and so no blemishes or contact marks remain due to the clip sections touching the surface of the wafer W, and it is possible to keep the wafer surface in a good condition.

When the arm 21 is at the substrate conveying position, the clip members 24 are also at the substrate conveying position with their tips opened out, as shown in FIG. 3. With this embodiment, a conveying device not shown is used to convey the wafer W from the right of FIG. 1 and FIG. 2 in the direction of the arrows, and mount it on the arm 21. Accordingly, the arrangement and opening angle of the clip members 24 on the arm 21 is determined so as not to interfere with conveyance of the wafer W. Also, when the clip members 24 are open at the substrate conveying position, the clip members 2 are moved away from the surface of the wafer W, and so they do not obstruct visual inspection.

The present invention also includes the following embodiments.

(1) With the above described embodiment, a wafer that has come away due to a vacuum suction defect abuts on the four clip members 24 and is prevented from dropping off, however, it is preferable to have at least three clip members. Also, the shape of the clip members 24 is not limited to the shape in the embodiment.

(2) When the wafer comes away, the tip abutment sections 24a abutting on the surface S of the wafer W, and the stepped abutment sections 24b abutting on the edge of the wafer, are formed integrally into the clip members 24, but it is also possible to provide them as separate members and to arrange and move them.

(3) The wafer is held by suction of the vicinity of the edge of the wafer W using the mounting pad sections 21b, but it is also possible to adopt a mechanism where a central part of the wafer W is held by vacuum suction.

(4) The wafer is sucked by vacuum suction, but it can also be sucked magnetically.

(5) Description has been given for a wafer inspection device, but in the case of an inspection device for a rectangular glass plate for a liquid crystal element, the shape of the arm 21 becomes rectangular or a partially cut-away rectangle. In this way, the shape of the support section for supporting the substrate depends on the shape of the substrate.

It is also possible to provide the substrate inspection device of the embodiment in an exposure device. An exposure device for semiconductor manufacture, an exposure device for liquid crystals for exposing a pattern of liquid crystal display element on a rectangular glass, or an exposure device for the manufacture of thin film magnetic heads can be given as examples of an exposure device. As a substrate to be the subject of visual inspection or light exposure, a semiconductor wafer or glass plate, etc. are adopted. Also, the substrate inspection device can be connected to a wafer conveying system in a light exposure device, and before or after light exposure the substrate is conveyed to the substrate inspection device and visual inspection is carried out.

What is claimed is:
1. A substrate dropping prevention mechanism fitted to a substrate holding device that is provided with a holding section that holds a substrate by sucking a first surface of the substrate, and a tilting mechanism that tilts said holding section, comprising:

a dropping prevention member that moves between a support posture for supporting the substrate that has come away from said holding section, and a retracted posture that is different from the support posture, and a movement mechanism that sets said dropping prevention member to the retracted posture when the substrate is in a substantially horizontal posture, with a first surface of the substrate facing downwards and a second surface of the substrate facing upwards, and sets said dropping prevention member to the support posture when the substrate is tilted by said tilting mechanism over a predetermined angle with respect to the horizontal.

2. The substrate dropping prevention mechanism according to claim 1, wherein:

said dropping prevention member has a first dropping prevention surface confronting a peripheral surface of the substrate, and a second dropping prevention surface confronting the second surface of said substrate, and the first and second dropping prevention surfaces are formed so as to respectively confront the peripheral surface and the second surface of the substrate when said dropping prevention member is moved to the support posture.

3. The substrate dropping prevention mechanism of claim 2, wherein:

when said dropping prevention member is moved to the support posture, the second dropping prevention surface confronts the second surface of the substrate with a gap between the second dropping prevention surface and the second surface of the substrate.

4. The substrate dropping prevention mechanism of claim 3, wherein said movement mechanism causes movement of said dropping prevention member between the retracted posture and the support posture by interlocking with a movement of said holding section caused by said tilting mechanism.

5. The substrate dropping prevention mechanism of claim 3, wherein said dropping prevention member is constituted of a plurality of dropping prevention parts provided at predetermined intervals on said holding section, and said plurality of dropping prevention parts are respectively arranged and postured so that conveyance of the substrate to said holding section is not prevented when moved to the retracted posture.

6. A substrate inspection device for carrying out visual inspection of an upper surface and a lower surface of a substrate, comprising: a support section that supports a substrate on a suction section by suction; a tilting mechanism that tilts said support section so as to move the substrate between a horizontal posture and a tilted posture; and a substrate holding device having the substrate dropping prevention mechanism according to claim 3.

7. The substrate dropping prevention mechanism of claim 2, wherein said movement mechanism causes movement of said dropping prevention member between the retracted posture and the support posture by interlocking with a movement of said holding section caused by said tilting mechanism.

8. The substrate dropping prevention mechanism of claim 2, wherein said dropping prevention member is constituted of a plurality of dropping prevention parts provided at predetermined intervals on said holding section, and said plurality of dropping prevention parts are respectively arranged and postured so that conveyance of the substrate to said holding section is not prevented when moved to the retracted posture.

9. A substrate inspection device for carrying out visual inspection of an upper surface and a lower surface of a substrate, comprising: a support section that supports a substrate on a suction section by suction; a tilting mechanism that tilts said support section so as to move the substrate between a horizontal posture and a tilted posture; and a substrate holding device having the substrate dropping prevention mechanism according to claim 2.

10. The substrate dropping prevention mechanism of claim 1, wherein said movement mechanism causes movement of said dropping prevention member between the retracted posture and the support posture by interlocking with a movement of said holding section caused by said tilting mechanism.

11. The substrate dropping prevention mechanism of claim 10, wherein:

said movement mechanism comprises
a spring that continuously urges said dropping prevention member toward the support posture, and
a linkage member that holds said dropping prevention member in the retracted posture against the urging force of said spring when said holding section is located in the horizontal state, and wherein:
said linkage member moves said dropping prevention member to the retracted posture against the spring force when said holding section in the tilted state is moved to the horizontal state, and
said dropping prevention member is moved to the support posture by said spring force when said holding section in the horizontal state is moved to the tilted state.

12. The substrate dropping prevention mechanism of claim 11, wherein said dropping prevention member is constituted of a plurality of dropping prevention parts provided at predetermined intervals on said holding section, and said plurality of dropping prevention parts are respectively arranged and postured so that conveyance of the substrate to said holding section is not prevented when moved to the retracted posture.

13. A substrate inspection device for carrying out visual inspection of an upper surface and a lower surface of a substrate, comprising: a support section that supports a substrate on a suction section by suction; a tilting mechanism that tilts said support section so as to move the substrate between a horizontal posture and a tilted posture; and a substrate holding device having the substrate dropping prevention mechanism according to claim 11.

14. The substrate dropping prevention mechanism of claim 10, wherein said dropping prevention member is constituted of a plurality of dropping prevention parts provided at predetermined intervals on said holding section, and said plurality of dropping prevention parts are respectively arranged and postured so that conveyance of the substrate to said holding section is not prevented when moved to the retracted posture.

15. A substrate inspection device for carrying out visual inspection of an upper surface and a lower surface of a substrate, comprising: a support section that supports a substrate on a suction section by suction; a tilting mechanism that tilts said support section so as to move the substrate between a horizontal posture and a tilted posture; and a substrate holding device having the substrate dropping prevention mechanism according to claim 10.

16. The substrate dropping prevention mechanism of claim 1, wherein said dropping prevention member is constituted of a plurality of dropping prevention parts provided at predetermined intervals on said holding section, and said plurality of dropping prevention parts are respectively arranged and postured so that conveyance of the substrate to said holding section is not prevented when moved to the retracted postured.

17. The substrate dropping prevention mechanism of claim 16, wherein:

when the substrate is a wafer, said support section is a partially cut away bracelet-shaped flat plate fit for a shape of the wafer, suction sections of said holding section are arranged at predefined intervals on one surface of said bracelet shaped flat plate, and said dropping prevention parts are arranged at predetermined intervals on said bracelet shaped flat plate so as to prevent the substrate dropping off from one surface of said bracelet shaped flat plate.

18. A substrate inspection device for carrying out visual inspection of an upper surface and a lower surface of a substrate, comprising: a support section that supports a substrate on a suction section by suction; a tilting mechanism that tilts said support section so as to move the substrate between a horizontal posture and a tilted posture; and a substrate holding device having the substrate dropping prevention mechanism according to claim 17.

19. A substrate inspection device for carrying out visual inspection of an upper surface and a lower surface of a substrate, comprising: a support section that supports a substrate on a suction section by suction; a tilting mechanism that tilts said support section so as to move the substrate between a horizontal posture and a tilted posture; and a substrate holding device having the substrate dropping prevention mechanism according to claim 16.

20. A substrate inspection device for carrying out visual inspection of an upper surface and a lower surface of a substrate, comprising: a support section that supports a substrate on a suction section by suction; a tilting mechanism that tilts said support section so as to move the substrate between a horizontal posture and a tilted posture; and a substrate holding device having the substrate dropping prevention mechanism according to claim 1.

* * * * *